July 20, 1965 W. B. ITTNER III 3,196,282
THIN-CRYOTRON WITH CRITICAL GATE THICKNESS
Filed May 17, 1960 2 Sheets-Sheet 1

INVENTOR
WILLIAM B. ITTNER III
BY Frederick J. Smyth
ATTORNEY

United States Patent Office 3,196,282
Patented July 20, 1965

3,196,282
THIN-CRYOTRON WITH CRITICAL GATE THICKNESS

William B. Ittner III, Poughkeepsie, N.Y., assignor to International Business Machines Corporation, New York, N.Y., a corporation of New York
Filed May 17, 1960, Ser. No. 29,662
7 Claims. (Cl. 307—88.5)

This invention relates to superconductive devices and more particularly to improved superconductive devices having optimized characteristics.

The phenomenon of superconductivity has been known for some fifty years and recently has been employed in the design of electrical circuits. By way of example, U.S. Patent 2,832,897 discloses a superconductive switching device, known as a cryotron, and various logical circuits employing this device. Briefly, the cryotron consists of a central wire, or gate conductor, around which is wound a single layer coil, or control conductor. The cryotron is normally maintained at a temperature at which the gate conductor is superconducting, that is, the gate conductor exhibits zero resistance to the flow of electric current. Current flow of at least a predetermined magnitude through the control conductor is effective to generate a magnetic field which when applied to the gate conductor destroys superconductivity therein, the gate conductor then exhibits normal electrical resistance.

A more recent superconductive switching device is described in copending application Serial No. 625,512, filed November 30, 1956, on behalf of Richard L. Garwin, and assigned to the assignee of this invention. As there shown, the device includes a thin film gate conductor and a thin film control conductor. This thin film device exhibits a more rapid switching time as compared to the above described wire wound cryotron. This results from the fact that the gate conductor of the thin film cryotron is characterized by an increased resistance when in the normal state and simultaneously a decreased inductance, by virtue of the shielding effect of a ground plane, and as shown in the hereinbefore referenced U.S. patent the switching speed of a cryotron is a function of the inductance and inversely proportional to resistance.

What has been discovered is an improved superconductive switching device wherein the geometry and material combine to yield maximum circuit gain simultaneously with minimum time constant at a selected operating temperature. As pointed out above, the $L/R$ cryotron time constant which determines the switching speed of the circuit in operation is inversely proportional to the resistance, and since the resistance of a thin film increases as the film thickness decreases, it would appear desirable to employ the thinnest possible films in superconductive switching devices to thereby attain a minimum time constant, an infinitely thin film exhibiting a time constant of zero. Because of the variation of penetration depth with film thickness, however, the current gain of very thin film cryotrons is decreased. Penetration depth has been defined in the various theories of superconductivity as a measure of the depth of penetration of the magnetic field into a superconducting conductor, and has been found to increase as the film thickness decreases. Therefore, in order to maintain the gain of a circuit as the thickness decreases, it is necessary to alter the circuit dimensions to compensate for the increased value of magnetic field required to switch the film between conduction states and the altered dimensions adversely effect the circuit time constant. The superconducting switching device, or thin film cryotron, of the invention, however, through a combination of dimensions and a proper choice of the superconductive gate material, provides a thin film cryotron having a minimum time constant, as more particularly described hereinafter. Further, the optimum thickness of the thin film cryotron of the invention for minimizing the circuit time constant increases as the material resistivity increases in contradistinction to the thin film cryotrons of the prior art wherein for a given gain the increased resistivity afforded by thinner films yielded a larger value of circuit time constant.

It is an object of the invention, therefore, to provide a superconductive device having optimized characteristics.

Another object of the invention is to provide a thin film superconductive device having maximum gain and minimum time constant.

Still another object of the invention is to provide a thin film cryotron having an optimum value of film thickness which minimizes the time constant for a predetermined gain and specified value of resistance.

A further object of the invention is to provide a thin film cryotron wherein the geometry and material combine to yield, at a selected operating temperature, maximum gain simultaneously with minimum time constant.

A related object of the invention is to provide an improved thin film cryotron employing novel superconductive material.

Yet another object of the invention is to provide an improved superconductive switching device having predetermined and reproducible characteristics.

The foregoing and other objects, features and advantages of the invention will be apparent from the following more particular description of a preferred embodiment of the invention, as illustrated in the accompanying drawings.

Figure 1:
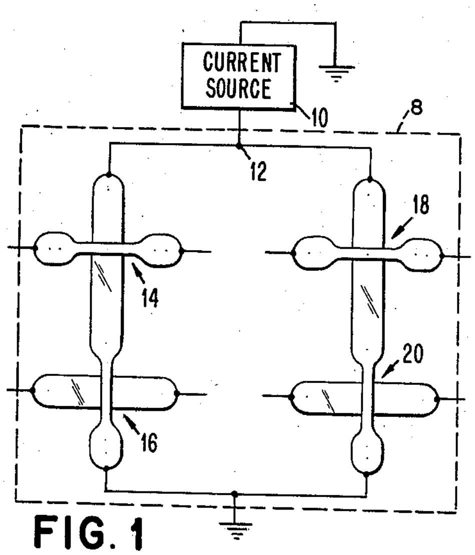
FIG. 1 is a schematic representation of a superconductive circuit.

Referring now to the drawings, FIG. 1 illustrates an elementary superconductive circuit useful in describing the thin film cryotron of the invention. The circuit of FIG. 1 is normally immersed in a liquid helium bath indicated by the dotted enclosure 8 so as to be maintained at superconductive temperatures. As there shown, current from a source 10 flows to a junction 12 and thence to ground through one of a pair of parallel superconductive paths. The first path includes the gate conductor of a first input cryotron 14 and the control conductor of a first sense cryotron 16. The second path includes the gate conductor of a second input cryotron 18 and the control conductor of a second sense cryotron 20. Current from source 10 is directed into one or the other of these paths by current flow through the appropriate control conductor of input cryotrons 14 and 18. By way of example, current flow through the control conductor of input cryotron 14, of at least a predetermined magnitude, switches a portion of the gate conductor thereof to the normal or resistive state and the entire current from source 10 is caused to flow in the superconducting second path. Upon the termination of current flow through the control conductor of cryotron 14, the first path again becomes superconducting. However, although there are now two superconducting paths in parallel, the entire current from source 10 continues to flow through the second path since there is no applied force, or potential, effective to shift the current from its established path. Current is shifted to, and then maintained in, the first path, through the energization of the control conductor of cryotron 18. Thus, the circuit of FIG. 1 is adaptable to function as a storage device, wherein current flow through the first path represents a binary 0 and current flow through the second path represents a binary 1, by way of example. The state of the circuit is indicated by a resistive one of the gate conductors of sense cryotrons 16 and 20, caused by current flow from source 10 flowing through the associated control conductor. FIG. 1 is illustrative of the type of operation encountered in more complex circuits. Only the simplest of these is shown to avoid complicating the analysis which follows.

More complex superconductive storage circuits, as well as various superconductive logical circuits have been designed, and, in general, each of these circuits also require that some or all of the current flowing in one superconductive path be shifted to flow through another superconductive path. For this reason, in the design of large scale systems, it is necessary that the current shift occur at as rapid a rate as possible to allow low cost, reliable, low power consuming cryotrons to be competitive with other well known devices.

Figure 2:
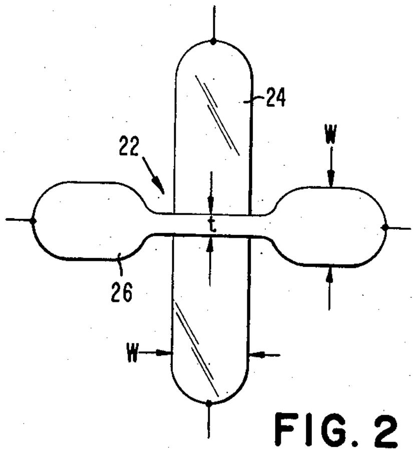
FIG. 2 is a schematic representation of an embodiment of the thin film cryotron of the invention.

The thin film cryotrons employed in the circuit of FIG. 1 are more particularly illustrated in FIG. 2. As shown in FIG. 2, a cryotron 22 includes a gate conductor 24 and a control conductor 26. Gate conductor 24 is of constant width W and thickness, $d_1$, in the order of a few thousand angstrom units. Control conductor 26 also is of constant width W except for the drive line portion traversing the gate conductor 24 which is of width $t$. As disclosed in the hereinbefore referenced copending application Serial No. 625,512, thin film cryotron 22 is mounted over a relatively thick superconducting ground plane and insulated therefrom by an insulating layer of thickness $d_2$, not shown, to thereby decrease the circuit inductance.

In order to particularly point out the advantages afforded by the thin film cryotron of the invention, a brief mathematical analysis of the time constant of the circuit of FIG. 1 is next described. Although the circuit as there shown is relatively simple, the following analysis is also applicable to more complex circuits. Further, as an aid in following the mathematics, the following assumptions are made, since they do not effect the form of the results, merely the magnitude thereof. First, as is generally the case all of the cryotrons of the circuit have similar dimensions and characteristics and therefore the $L/R$ time constant of the circuit is determined essentially by the $L/R$ time constant of the cryotron and each of the parallel paths between terminal 12 and ground have a constant width, W, except for the drive line portion of the control conductors of cryotrons 16 and 20 which have a width $t$. Further, the thickness of each gate conductor is $d_1$ and constant throughout the length of the path, each path length being defined as $B/2$.

The time constant of the circuit of FIG. 1 which as heretofore stated, is a function of the inductance and inversely proportional to the resistance, that is $L/R$, is defined by Equation 1:

$$L/R=\frac{wd_1}{\rho t}4\pi(d_2+\lambda_1+\lambda_\epsilon)\left(\frac{B}{W}+\frac{2W}{t}\right)\times 10^{-9}\text{ seconds} \quad (1)$$

where $W$=the gate conductor width;

$d_1$=the thickness of the gate film;

$\rho$=the normal resistivity of the gate film which is a function of the gate material and thickness;

$t$=the width of the drive line portion of the control conductor;

$d_2$=the thickness of the insulating layer between the gate and the ground plane;

$\lambda_1$=the penetration depth in the ground plane;

$\lambda_\epsilon$=the effective penetration depth in the gate film which is the actual experimentally determined penetration depth exhibited by a thin film specimen and is a function of the superconductive temperature and also is a function of the film thickness and purity; and $B$=the total circuit length.

Figure 3:
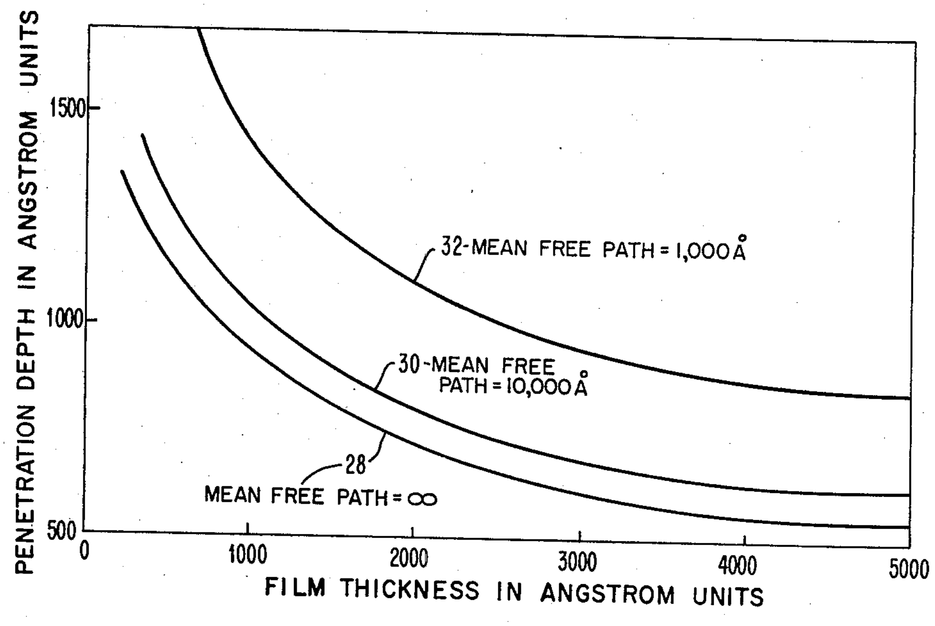
FIG. 3 is a family of curves illustrating the effective penetration depth in various thin films.

Equation 1 indicates that the circuit time constant is a function of the dimensions of the circuit, such as W, $d_1$, $t$, $d_2$ and B, and of the material characteristics of the gate film, such as $\rho$ and $\lambda_\epsilon$, and it appears that an increase in the resistivity, $\rho$, is effective to reduce this time constant. Resistivity may be increased by using impure or alloyed materials or by employing thinner films. However, in very thin films of either a pure or dilute alloy superconductive material, the effective penetration depth, $\lambda_\epsilon$, is also increased and, as hereinafter described in detail, for a given gain is effective to increase the time constant in very thin or impure thin films. Referring now to FIG. 3, a curve 28 indicates the variation of the effective penetration depth, $\lambda_\epsilon$, as a function of the film thickness in an ideally pure thin film of tin, that is, a film having a mean free path of infinity. For films greater in thickness than about 2500 angstrom units, the effective penetration depth is essentially constant. Films thinner than this value, however, exhibit a significant increase in the effective penetration depth. Curve 30 of FIG. 3 represents a similar variation in a relatively pure thin film of tin, having a mean free path of 10,000 angstrom units where again the effective penetration depth is essentially constant for films of a thickness greater than about 2500 angstrom units, and increasing in films of lesser thickness. Further, each of curves 28, representing an ideally pure film, and 30, representing a relatively pure film, are comparable in magnitude. The effective penetration depth of a relatively impure thin tin film with a mean free path of about 1000 angstrom units, is shown in curve 32 of FIG. 3. The shape of curve 32 approximates that of both curves 28 and 30, but the magnitude of the effective penetration depth is markedly increased. The general feature of the result shown in FIG. 3 may be summarized by the statement that the effective penetration depth is relatively independent of both the mean free path (purity of the superconductive material) and film thickness as long as each are greater than a characteristic length known as the "superconducting coherence length," which is a measure of the effective distance over which the electrons cooperating in the phenomenon of superconductivity interact with one another, defined in the recent theory of superconductivity published in the Physical Review, vol. 108, page 1175, 1957, by J. Bardeen, L. N. Cooper and J. R. Schrieffer.

This variation of the effective penetration depth as a function, not only of the specimen purity, but of the specimen thickness as well, is completely unexpected from the classic theory of superconductivity of F. and H. London, published in the Proceedings of the Royal Society A, vol. 149, 1935, at page 71. Although the fact that the penetration depth is a function of temperature, being essentially constant from absolute zero (0° Kelvin) to about 80% of the critical temperature and exponentially increasing thereafter, has been known, the variation of the effective penetration depth as a function of both the purity and thickness of the superconductive material as shown in FIG. 3 results in a change in the design philosophy of superconductive thin film cryotrons as will be more apparent as the discussion proceeds.

Before continuing with the analysis of the results indicated by Equation 1, the form of the equation will be altered in order to eliminate several of the many variables therein and to cast it in a form more amenable to analysis. The ratio $B/W$, the length of the circuit to the width of the gate strip, is a variable which, in practice, is fixed by the design of the circuit, and in the calculations to follow, this ratio is replaced by K, a design parameter. Next, neglecting the edge effects in both the gate conductor and control conductor due to the presence of the superconducting ground plane, the critical control current, $I_c$, which is well known to be the magnitude of current through the control conductor which quenches superconductivity in the gate conductor in the absence of current flow through the gate conductor as derived from the circuital form of Ampere's law is found to be:

$$I_c=\frac{H_g t}{2\pi} \qquad (2)$$

where $H_g$= the critical field of the gate conductor; and
$t$=the width of the control conductor.

Further, the equation for the critical gate current which is the magnitude of current which of and by itself flowing through the gate conductor quenches superconductivity therein in the absence of current flow through the control conductor has been experimentally determined to have the approximate form of $$I_g\cong\frac{WHc}{4\pi}\tanh d_1/\lambda_\epsilon \qquad (3)$$

where $W$=the width of the gate conductor;
$H_c$=the critical field of the bulk superconductive material;
$d_1$=the thickness of the gate conductor material; and
$\lambda_\epsilon$=the effective penetration depth of the gate conductor.

Next, solving Equation 2 for $t$ and Equation 3 for W and substituting these values in Equation 1, Equation 1 obtains the form:

$$\frac{L}{R}=8\pi\frac{d_1}{\rho}\frac{H_g I_g(d_2+\lambda_1+\lambda_\epsilon)}{H_c\ I_c \tanh d_{1/2}\lambda_\epsilon}\left(K+\frac{4I_g}{I_c}\frac{H_g}{H_c}\frac{1}{\tanh\ d_{1/2}\lambda_\epsilon}\right)\times 10^{-9} \qquad (4)$$

Examination of Equation 4 shows that $I_g/I_c$, which is by definition the gain G of a thin film cryotron and therefore a design parameter, again determined by circuit considerations, is directly related to the circuit time constant. Further, the ratio of the critical field of the thin film to the critical field of the bulk superconductive material $H_g/H_c$, is shown to be by the Londons' classic theory of superconductivity:

$$\frac{H_g}{H_c}=\frac{1}{\left(1-\frac{2\lambda}{d_1}\tanh d_{1/2\lambda}\right)^{1/2}} \qquad (5)$$

where $d_1$=the thickness of the gate conductor, and
$\lambda$=the penetration depth as defined by London. According to the concepts of this invention it is necessary to replace the London penertation depth by an effective penetration depth;
$\lambda_\epsilon$=the effective penetration depth in the film as a function of the film purity and thickness as is shown in FIG. 3 and as results from the more recent theories hereabove referred to.

Figure 5:
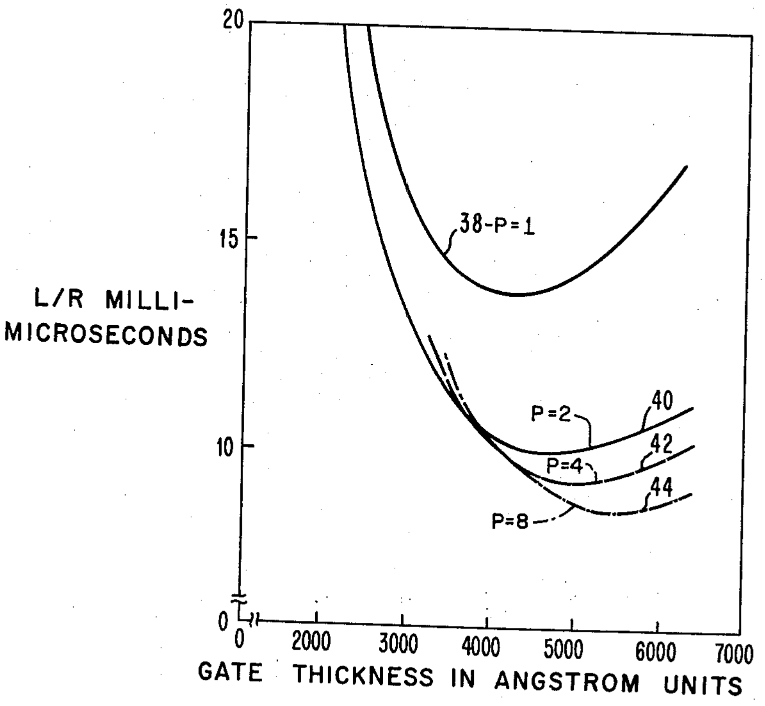
FIG. 5 is a family of curves illustrating the variation of time constant as a function of film thickness for thin film having various values of resistivity.

Now, to analyze the results of Equation 4, the design parameters and physical constants, K, G, $d_2$ and $\lambda_1$, are chosen and the $L/R$ time constant is thus seen to be a function of $d_1$, $\rho$ and $\lambda_\epsilon$, where $\lambda_\epsilon$ is additionally a function of $d_1$, $\rho$ and operating temperature T. FIG. 5 shows the variation of the $L/R$ time constant as a function of the thickness of the gate conductor, for a group of thin film cryotrons having constant gain, as determined from Equation 4. For the specific examples illustrated in FIG. 5, the values listed in Table I have been chosen, it being understood that a wide range of values are also possible.

*Table I*

| Parameter: | Value |
|---|---|
| K | 100. |
| G | 1. |
| $d_2$ | 2000 Angstrom units. |
| $\lambda_1$ | 500 Angstrom units. |
| T | 0.8 $T_c$ (critical temperature). |

Curve 38 of FIG. 5, obtained with a gate material of one micro-ohm-centimeter resistivity, indicates that a minimum time constant of 14 millimicroseconds is attained with a gate thickness of about 4200 Angstrom units. Doubling the resistivity of the gate material to two micro-ohm-centimeter reduces the minimum time constant to about 10 millimicroseconds at an increased gate thickness of about 4500 Angstrom units as shown by curve 40 of FIG. 5. Again doubling the resistivity of the gate material to four micro-ohm-centimeter, the minimum time constant is reduced to about 9.3 millimicroseconds at an increased gate thickness of 5000 Angstrom units as shown by curve 42 of FIG. 5. Curve 44 of FIG. 5 shows the further decrease in circuit time constant as the resistivity is again doubled to eight micro-ohm-centimeter; a minimum time constant of 8.5 millimicroseconds being attained in a film about 5100 Angstrom units in thickness. In the absence of penetration depth effects, the $L/R$ time constant would decrease linearly with film thickness, $d_1$, approaching zero for an infinitely thin film as a result of the resistance increase with decreasing thickness. Because of penetration depth effects, however, the gain of a very thin film cryotron is descreased and if the gain were required to remain constant due to circuit requirements, it is then necessary to readjust the cryotron dimensions and, adversely, alter the circuit time constant. Thus for a predetermined gain, a thinner gate film can result in a larger time constant than a thicker gate film and, as shown in FIG. 5, there is a definite optimum value of gate film thickness which minimizes the cryotron time constant for the predetermined gain. Further, FIG. 5 indicates the manner in which the circuit time constant varies with the resistivity of the film. In the absence of penetration depth effects, the time constant would be inversely proportional to the film resistivity. However, because the effective penetration depth increases with increased resistivity (compare curves 28 and 32 of FIG. 3), there is a diminishing return associated with successive resistivity increases. By way of example, doubling the resistivity from one to two micro-ohm-centimeter is effective to reduce the time constant by about 5 millimicroseconds. Yet doubling the resistivity from four to eight micro-ohm-centimeters is effective to reduce the time constant merely 0.8 millimicrosecond.

A further feature of the family of the parabolic curves shown in FIG. 5 is that the optimum film thickness for minimizing the circuit time constant, at a constant gain, increases as the material resistivity increases. As shown in FIG. 5, the minimum circuit time constants are attained with relatively thick films of about 4500 Angstrom units in contradistinction to the expectations of the prior art. Additionally, the curves of FIG. 5 indicate the time constants at a fixed temperature. Since the penetration depth is also a function of temperature, higher time constants are obtained at operating temperatures closer to the critical temperature and lower time constants are obtained at operating temperatures closer to absolute zero.

However, in either of these cases, a family of curves of the same general shape of those of FIG. 5, is obtained.

Figure 4:
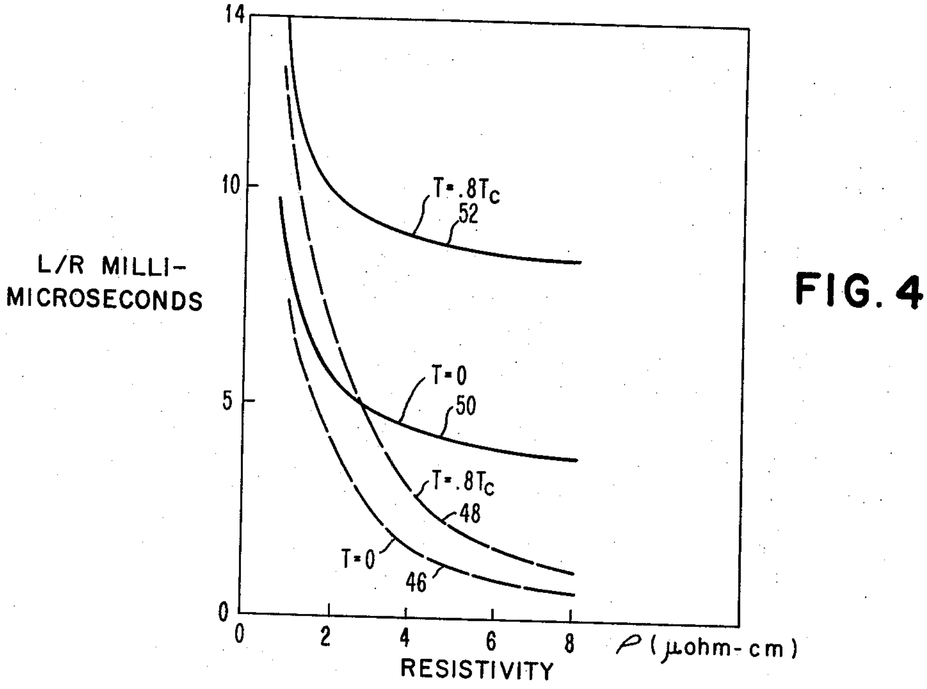
FIG. 4 is a family of curves illustrating the minimum time constant, independent of film thickness, as a function of the resistivity of the film material at various temperatures.

Referring now to FIG. 4, there is illustrated a family of curves indicating the minimum time constant, independent of film thickness, as a function of the resistivity of the film material. Curves 46 and 48 indicate the minimum time constant at operating temperatures of 0° Kelvin and 0.8 $T_c$, respectively, where $T_c$ is the critical temperature of the film material. In the absence of penetration depth effects, these curves would be a simple inverse relationship between time constant and resistivity as shown. Curves 50 and 52 indicate the minimum time constant at operating temperatures of 0° Kelvin and 0.8 $T_c$, respectively, as determined from Equation 4. It is apparent that by increasing the resistivity, and appropriately increasing the film thickness (see FIG. 5), the circuit time constant is reduced. It is also apparent from FIG. 4 that little reduction in the circuit time constant is attained for resistances greater than about four micro-ohm-centimeter.

In order to obtain the advantages of the thin film cryotron of the invention, namely, minimum time constant with maximum gain, the following procedure is employed. From circuit considersations, the various design parameters and physical constants such as K, G, $d_2$, $\lambda_1$, are chosen, as well as an operating temperature T. Next, a reasonable choice of resistivity is made by inspection of a family of curves such as those shown in FIG. 5, thereby obtaining a predetermined film thickness for optimizing the characteristics of the cryotron. In general, the resistivity chosen is greater than that obtainable in a thin film of a single superconductive element, and an alloy of superconductive elements is required. However, alloys present a problem when employed in superconductive switching circuits in that, generally, the transitions between the superconducting and resistive conduction states are relatively broad, that is, a large increase in the applied magnetic field or the operating temperature is required between the point where resistance first begins to appear and the point where full resistance is obtained. These broad transitions result from the dependence of both the critical field and critical temperature on the alloy composition and a solidified alloy contains a finite range of composition. Thus, each microscopic portion of the alloy may have a different critical field and critical temperature and the resulting broad transistions seriously reduce the circuit time constant.

A class of alloys disclosed in copending application Serial No. 814,495, filed May 20, 1959, now abandoned. on behalf of Morton D. Reeber and assigned to the assignee of this invention, is characterized by transition sharpness comparable to that obtained in a pure superconductive element, while simultaneously retaining the increased resistivity afforded by alloy superconductive materials. This class of alloys comprises a first superconductive material to which is added a predetermined amount of a second superconductive material, the resulting alloy positioned at the minimum of the critical temperature versus composition curve. The sharp magnetic and temperature transition curves result from the fact that although each microscopic portion of the alloy may have its individual critical field and critical temperature, yet all of these critical fields and temperatures can be maintained within a narrow range. Therefore, the class of alloys of the copending application is ideally suited for use as the gate conductor of the thin film cryotron of the present invention wherein an increased resistivity is required together with a narrow transition width to attain a minimum time constant.

In order to aid in understanding the invention, the following information on specific values and materials is presented, by way of example, but it should be understood that variations in the specific values and materials may be employed by those skilled in the art while maintaining the advantages afforded by the invention. Referring again to FIGS. 2 and 5, the width, W, of the gate is 0.03 inch, and the width, $t$, of the drive element portion of the control is 0.015 inch, each formed above a superconducting ground plane. Both the ground plane and the control conductor are fabricated of lead, and the gate conductor is fabricated of an alloy of 97% tin and 3% indium. Since the resistivity of the alloy of this example is about two micro-ohm-centimeter, the thickness of the gate, $d_1$, is 4500 Angstrom units in order to attain a minimum circuit time constant of about 10 millimicroseconds.

While the invention has been particularly shown and described with reference to a preferred embodiment thereof, it will be understood by those skilled in the art that various changes in form and details may be made therein without departing from the spirit and scope of the invention.

What is claimed is:

1. A thin film superconductive switching device comprising: a planar superconductive gate conductor and a planar superconductive control conductor arranged in magnetic field applying relationship therewith; said gate conductor consisting of a superconductive material exhibiting a predetermined value of resistivity; and means maintaining said device at a predetermined temperature at which said gate and control conductors are each superconducting; said gate conductor being of a thickness to reduce to substantially zero the slope of the inductance-to-resistance time constant versus gate conductor thickness curve of said device, whereby said device exhibits the minimum switching time as determined by said predetermined value of resistivity at said predetermined temperature.

2. The device of claim 1, wherein said resistivity value is two micro-ohm-centimeter, said gate conductor thickness is 4500 Angstrom units and said minimum time constant is 10 millimicroseconds.

3. In a thin film cryotron device including a planar gate conductor and a planar control conductor arranged in magnetic field applying relationship therewith, said device being operable at a superconductive temperature whereat the relationship between the inductance-to-resistance time constant of said device and the thickness of said gate conductor is essentially parabolic, the improvement consisting in that said gate conductor is of a thickness to substantially minimize said time constant of said device as manifested by said parabolic relationship whereby said device exhibits a lower time constant than a similar device having a thicker or a thinner gate conductor.

4. A planar cryotron including a superconductive gate conductor and a superconductive control conductor arranged in magnetic field applying relationship, the relationship between the inductance-to-resistance time constant of said cryotron and the thickness of said gate conductor being such that said time constant decreases to a minimum value as the thickness of said gate conductor decreases from a relatively large value to a first value and thereafter increases as the thickness of said gate conductor further decreases below said first value, the relationship between said minimum value of said time constant and the resistivity of said gate conductor material being such that said minimum time constant decreases as said resistivity is increased, and means maintaining said cryotron at a predetermined temperature whereat each of said gate and said control conductors are superconducting, said gate conductor formed of a material having a particular value of resistivity and being of a thickness substantially equal to said first value for said particular value of resistivity, whereby said cryotron exhibits said minimum time constant for said particular value of resistivity at said predetermined temperature.

5. The cryotron of claim 4 wherein said predetermined temperature is 0.8 the critical temperature of said gate conductor material; the resistivity of said gate conductor material is one micro-ohm-centimeter; and said gate conductor thickness is 4200 Angstrom units.

6. The cryotron of claim 4 wherein said predetermined temperature is 0.8 the critical temperature of said gate conductor material; the resistivity of said gate conductor material is eight micro-ohm-centimeter; and said gate conductor is 5100 Anstrom units.

7. A planar cryotron including a thin film superconductive gate conductor and a thin film superconductive control conductor arranged in magnetic field applying relationship therewith, the relationship between the inductance-to-resistance time constant of said cryotron and the thickness of said gate conductor defining a family of parabolic curves for individual values of resistivity of said gate conductor material when said cryotron is maintained at a particular operating temperature, each of said curves having a minimum inductance-to-resistance time constant at a particular value of gate conductor thickness, said time constant of said cryotron increasing as said gate conductor thickness is varied in either direction from said particular value and means maintaining said cryotron at a predetermined temperature at which each of said gate and said control conductors are normally superconducting, the resistivity and thickness of said gate conductor being so related that said cryotron exhibits a minimum time constant at said predetermined temperature.

References Cited by the Examiner

UNITED STATES PATENTS 2,966,647 12/60 Lentz ---------------- 307—88.5

OTHER REFERENCES

"The Cryotron—A Superconductive Computer Component," by D. A. Buck, Proceedings of the I.R.E., April 1956 (pp. 482 to 493).

Pub. 1: "Symposium On Superconductive Techniques," ONR Report ACR-50, May 17–19, 1960, Schmidlin article, pp. 130–152 (only pages 145 and 148 relied on).

ARTHUR GAUSS, *Primary Examiner.*

GEORGE N. WESTBY, JOHN W. HUCKERT, *Examiners.*